(12) United States Patent
Polo (10) Patent No.: US 11,761,929 B2
(45) Date of Patent: Sep. 19, 2023

(54) SENSOR APPARATUS FOR LITHOGRAPHIC MEASUREMENTS

(71) Applicant: ASML Netherlands B.V., Veldhoven (NL)

(72) Inventor: Alessandro Polo, Arendonk (BE)

(73) Assignee: ASML Netherlands B.V., Veldhoven (NL)

( * ) Notice: Subject to any disclaimer, the term of this patent is extended or adjusted under 35 U.S.C. 154(b) by 432 days.

(21) Appl. No.: 17/251,533

(22) PCT Filed: May 29, 2019

(86) PCT No.: PCT/EP2019/064082
§ 371 (c)(1),
(2) Date: Dec. 11, 2020

(87) PCT Pub. No.: WO2019/243017
PCT Pub. Date: Dec. 26, 2019

(65) Prior Publication Data
US 2021/0239654 A1 Aug. 5, 2021

(30) Foreign Application Priority Data
Jun. 19, 2018 (EP) .................... 18178414

(51) Int. Cl.
*G01N 29/07* (2006.01)
*G01N 29/22* (2006.01)
(Continued)

(52) U.S. Cl.
CPC ........... *G01N 29/07* (2013.01); *G01N 29/221* (2013.01); *G01N 29/2418* (2013.01);
(Continued)

(58) Field of Classification Search
CPC .. G01N 29/07; G01N 29/221; G01N 29/2418; G01N 29/28; G01N 29/024;
(Continued)

(56) References Cited

U.S. PATENT DOCUMENTS 5,296,254 A 3/1994 Tsuru
6,952,253 B2 10/2005 Lof et al.
(Continued)

FOREIGN PATENT DOCUMENTS

CN 110945436 A 3/2020
EP 1 150 173 A2 10/2001
(Continued)

OTHER PUBLICATIONS

Kamida et al., "Development of scanning acoustic microscope with high depth resolution," Leading-Edge Technology and Research, vol. 51, No. 4, Apr. 1985; 7 pages.
(Continued)

*Primary Examiner* — Jacques M Saint Surin
(74) *Attorney, Agent, or Firm* — Sterne, Kessler, Goldstein & Fox P.L.L.C.

(57) ABSTRACT

A sensor apparatus comprising an acoustic assembly arranged to transmit an acoustic signal to a substrate and receive at least part of the acoustic signal after the acoustic signal has interacted with the substrate, a transducer arranged to convert the at least part of the acoustic signal to an electronic signal, and, a processor configured to receive the electronic signal and determine both a topography of at least part of the substrate and a position of a target of the substrate based on the electronic signal. The sensor apparatus may for part of a lithographic apparatus or a metrology apparatus.

19 Claims, 7 Drawing Sheets

(51) Int. Cl.
*G01N 29/24* (2006.01)
*G01N 29/28* (2006.01)
*G03F 9/00* (2006.01)

(52) U.S. Cl.
CPC .......... *G01N 29/28* (2013.01); *G03F 9/7053* (2013.01); *G03F 9/7084* (2013.01); *G03F 9/7088* (2013.01); *G01N 2291/044* (2013.01); *G01N 2291/2697* (2013.01)

(58) Field of Classification Search
CPC ....... G01N 29/2437; G01N 2291/2697; G01N 2291/044; G01N 2291/101; G01N 2291/103; G01N 2291/102; G01N 2291/048; G03F 9/7053; G03F 9/7084; G03F 9/7088; G03F 9/7003
USPC .......................................................... 73/597
See application file for complete search history.

(56) References Cited

U.S. PATENT DOCUMENTS

| | | | |
|---|---|---|---|
| 7,391,676 B2 | 6/2008 | Bruinsma et al. | |
| 7,502,103 B2* | 3/2009 | Plug | G03F 7/70758 430/5 |
| 7,586,598 B2* | 9/2009 | Plug | G03F 7/70766 430/5 |
| 7,961,309 B2* | 6/2011 | Plug | G03F 7/70758 318/568.17 |
| 8,319,940 B2* | 11/2012 | Butler | G03F 9/7015 355/75 |
| 9,665,012 B2* | 5/2017 | Hulsebos | G03F 7/709 |
| 9,746,312 B2* | 8/2017 | Butler | G01B 11/14 |
| 10,444,638 B2 | 10/2019 | Pandey et al. | |
| 2003/0023393 A1 | 1/2003 | Oravecz | |
| 2006/0133209 A1 | 6/2006 | Bruinsma et al. | |
| 2013/0065328 A1 | 3/2013 | Wang et al. | |
| 2021/0364936 A1 | 11/2021 | Pandey et al. | |

FOREIGN PATENT DOCUMENTS

| | | |
|---|---|---|
| EP | 3 258 275 A1 | 12/2017 |
| JP | H05-4007 A | 1/1993 |
| JP | 2000-028589 A | 1/2000 |
| JP | 2002-243710 A | 8/2002 |
| JP | 2006-179902 A | 7/2006 |
| JP | 2021-511485 A | 5/2021 |
| WO | WO 2019/145101 | 8/2019 |

OTHER PUBLICATIONS

Ishikawa, Kiyoshi, "Scanning Acoustic Microscope," The Society of Rubber Science and Technology, vol. 61, No. 4, 1988; 9 pages.
International Search Report an Written Opinion of the International Searching Authority directed to related International Patent Application No. PCT/EP2019/064082, dated Jul. 26, 2019; 12 pages.
International Preliminary Report on Patentability directed to related International Patent Application No. PCT/EP2019/064082, dated Dec. 22, 2020; 9 pages.

* cited by examiner

SENSOR APPARATUS FOR LITHOGRAPHIC MEASUREMENTS

CROSS-REFERENCE TO RELATED APPLICATIONS

This application claims priority of EP application 18178414.1 which was filed on 19 Jun. 2018 and which is incorporated herein in its entirety by reference.

FIELD

The present invention relates to an acoustic sensor apparatus and a corresponding method for performing lithographic measurements.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually reduced whilst the amount of functional elements, such as transistors, per device has been steadily increasing over decades, following a trend commonly referred to as 'Moore's law'. To keep up with Moore's law the semiconductor industry is pursuing technologies that enable the creation of progressively smaller features. To project a pattern on a substrate a lithographic apparatus may use electromagnetic radiation. The wavelength of this radiation at least partially determines the minimum size of features that are patterned on the substrate. Typical wavelengths currently in use are 365 nm, 248 nm, 193 nm and 13.5 nm. A lithographic apparatus which uses extreme ultraviolet (EUV) radiation, having a wavelength within a range of 4 nm to 20 nm (e.g. 6.7 nm or 13.5 nm) may be used to form smaller features on a substrate than a lithographic apparatus which uses, for example, radiation having a wavelength of 193 nm.

It is an object of the present invention to provide a sensor apparatus and method of determining a topography of at least part of a substrate and a position of a target of the substrate which at least partially addresses one or more of the problems of the prior art, whether identified herein or elsewhere.

SUMMARY

According to a first aspect of the invention there is provided a sensor apparatus comprising an acoustic assembly arranged to transmit an acoustic signal to a substrate and receive at least part of the acoustic signal after the acoustic signal has interacted with the substrate, a transducer arranged to convert the at least part of the acoustic signal to an electronic signal, and a processor configured to receive the electronic signal and determine both a topography of at least part of the substrate and a position of a target of the substrate based on the electronic signal.

An embodiment according to the first aspect of the invention advantageously enables measurement of both the position of the target on the substrate and the topography of the substrate using a single device. This provides a far simpler apparatus than using separate position sensors and topography sensors. This also advantageously enables increased throughput of a lithographic apparatus utilizing the sensor apparatus because both position measurements and topography measurements may be completed during a single scan of the substrate using a single sensor apparatus rather than through multiple scans of the substrate using multiple sensor apparatus. Known position sensors and topography sensors typically use radiation for measurements. Substrates may comprise opaque layers between a position sensor and a target, such as an alignment mark, thereby making it difficult for radiation-based position sensors to detect the position of targets. Furthermore, radiation used for topography measurements may undergo internal reflections between different layers of the substrate resulting in unwanted interference of the radiation beam. This in turn may cause topography measurement errors such as, for example, apparent surface depression. Use of an acoustic signal advantageously obviates or mitigates the problems listed above that are associated with the use of optical signals. Targets, such as alignment marks, may be present on an uppermost surface of the substrate (i.e., the target may form part of the topography of the substrate). In this case, measurement of the topography of at least part of the uppermost surface of the substrate and a position of a target of the substrate may be simultaneous. The topography of a surface that is not the uppermost surface of the substrate may be determined using the sensor apparatus. The topography measurement and the position measurement may not be simultaneous. The topography measurement and the position measurement may both be performed by the sensor apparatus within a single measurement scan of the substrate. The processor may be configured to output a measurement signal that is indicative of the topography of the at least part of the substrate and the position of the target. The processor may provide the measurement signal to a controller configured to control a lithographic apparatus in dependence on the measurement signal. The target may be referred to as an alignment mark. The at least part of the substrate and the target may be located at different depths with respect to the transducer.

The processor may be configured to receive the electronic signal from at least two different temporal detection windows. The processor may receive a part of the electronic signal corresponding to the topography of the substrate from one of the temporal detection windows and another part of the electronic signal corresponding to the position of the target from another temporal detection window. This advantageously enables measurement of topography and target position when the target is located at a different depth to the topography of the substrate, e.g., when the target is buried under one or more layers of the substrate.

The processor may be electronically gated to receive the at least part of the signal from the at least two different temporal detection windows. The electronic gating may be performed via switching means configured to activate the sensor apparatus during different temporal detection windows of interest and deactivate the sensor apparatus during temporal windows that are not of interest. Alternatively and/or additionally, the electronic gating may comprise a post-processing step in which the electronic signal is analysed after the measurement has taken place, and the acoustic signals of interest are selected from a plurality of returning acoustic signals. That is, the electronic signal associated with different temporal detection windows of interest may be selected after the processor has received the electronic signal from all temporal detection windows.

The processor may be configured to at least partially account for the topography of the at least part of the substrate when determining the position of the target of the substrate. The topography of the substrate may affect an accuracy of the measurement of the position of the target e.g., due to the substrate being warped. Accounting for the topography of the at least part of the substrate when determining the position of the target advantageously improves an accuracy of the position measurement by at least partially correcting for the measured topography of the substrate.

The acoustic signal may be a continuous wave configured to generate at least one standing wave between the transducer and the substrate. The processor may be configured to determine a wavelength of the standing wave based on the electronic signal. The processor may be further configured to use the wavelength of the standing wave when determining both the topography of the at least part of the substrate and the position of the target of the substrate.

Using a continuous wave acoustic signal advantageously improves an accuracy of the topography measurement. The acoustic signal may be a pulse.

The transducer may be further configured to emit the acoustic signal. The sensor apparatus may further comprise another transducer configured to emit the acoustic signal. This advantageously provides a source of the acoustic signal within the sensor apparatus. The sensor apparatus may comprise any number of transducers, e.g., five transducers. The transducers may be provided in any desired arrangement, e.g., central generally circular transducer substantially surrounded by four substantially equivalent transducers that take the form of sections of an annulus.

The acoustic assembly may comprise a first acoustic lens configured to direct the acoustic signal towards the substrate. The acoustic assembly may further comprise a second acoustic lens configured to direct the at least part of the acoustic signal towards the transducer. The acoustic assembly may comprise any number of acoustic lenses. Providing an acoustic lens advantageously focusses the acoustic signal and/or the at least part of the acoustic signal after interaction with the substrate so as to reduce signal losses, improve a signal to noise ratio of the measurements, and thereby improve an accuracy of the measurements performed using the sensor apparatus.

The sensor apparatus may further comprise a body of fluid located between the transducer and the substrate. The fluid may be a liquid. The liquid may be water. Providing the body of fluid advantageously provides an acoustically transmissive medium to transfer the acoustic signal between the sensor apparatus and the substrate. Water has been found to work well in this regard.

The sensor apparatus may further comprise a fluid control system configured to provide the body of fluid. The fluid control system may comprise one or more conduits configured to provide and/or remove at least some of the body of fluid. The fluid control system may be configured to control a temperature of the fluid. The fluid control system may be configured to replenish, filter and/or refresh the body of fluid. The fluid control system advantageously provides greater control of the acoustic assembly, thereby offering greater flexibility, e.g., for performing different measurements on different substrates using the sensor apparatus.

The acoustic assembly may be configured to transmit the acoustic signal having a frequency of between about 100 MHz and about 10 GHz. This advantageously enables detection of features of the size that are commonly used in existing lithographic methods and apparatus.

The sensor apparatus may further comprise an actuation system configured to generate relative movement between the sensor apparatus and the substrate. The relative movement may be such that the transducer receives the at least part of the reflected acoustic signal after the acoustic signal has interacted with the substrate at a plurality of different locations on the substrate. This advantageously provides target position information and topography information in a single scan of the substrate which saves time and, when used as part of a lithographic process, improves a throughput of the lithographic process.

The transducer may comprise an optically reflective member. The sensor apparatus may further comprise an optical detector comprising an interferometric detection scheme having at least one interferometric branch in optical communication with the optically reflective member. The optically reflective member may be configured to receive the at least part of the reflected acoustic signal and thereby undergo a mechanical displacement. The optical detector may be configured to detect a change in phase of the at least one of the interferometric branches caused by the displacement of the second transducer. The determined change in phase may be used to determine a topography of the at least part of the substrate and the position of the target. The change in phase may be measured in time either continuously or periodically, e.g., during a measurement scan of the substrate.

The sensor apparatus may form part of a metrology apparatus. The metrology apparatus may use the sensor apparatus to perform topography measurements of a substrate and position measurements of a target of the substrate. Performing position measurements of a target of the substrate may comprise performing an alignment measurement, an overlay measurement and/or a critical dimension measurement of the substrate.

The sensor apparatus may comprise a first transducer and a first acoustic assembly located on a first side of the substrate and a second transducer and a second acoustic assembly located on a second side of the substrate which is opposite to the first side of the substrate. The first transducer may be configured to emit an acoustic signal, which is collected by the first acoustic assembly and directed to the substrate. The acoustic signal may be transmitted by the substrate such that the acoustic signal traverses the substrate, interacts with one or more interfaces within the substrate so as to produce the at least part of the acoustic signal, exits the second side of the substrate and is collected by the second acoustic assembly. The second acoustic assembly may direct the at least part of the acoustic signal to the second transducer. The second transducer may convert the at least part of the acoustic signal to an electronic signal and provide the electronic signal to the processor for determining the topography of the at least part of the substrate and the position of the target of the substrate.

The acoustic assembly may be configured to transmit the acoustic signal to the substrate such that the acoustic signal interacts with one or more interfaces of the substrate at a non-zero angle with respect to a central axis of the sensor apparatus. At least part of the acoustic signal that has interacted with the one or more interfaces of the substrate may be collected by the acoustic assembly. The acoustic assembly may direct the at least part of the acoustic signal to a second transducer. The second transducer may be arranged to convert the at least part of the acoustic signal to an electronic signal. The sensor apparatus comprises a processor configured to receive the electronic signal and determine both a topography of at least part of the substrate and a position of the target of the substrate based on the electronic signal. Arranging the acoustic assembly and the transducers so as to cause the acoustic signal to interact with one or more interfaces of the substrate at a non-zero angle with respect to a central axis of the sensor apparatus advantageously improves an ability of the sensor apparatus to detect parts of the acoustic signal that have interacted with the substrate at different angles of incidence. This provides additional information of the structure of the substrate and improves an accuracy of the measurement of the topography of at least part of the substrate and the position of the target of the substrate.

Alternatively or additionally, the acoustic assembly may be configured to transmit the acoustic signal to the substrate such that the acoustic signal interacts with one or more interfaces of the substrate at an angle of substantially zero with respect to a central axis of the sensor apparatus. This advantageously improves an ability of the sensor apparatus to detect parts of the acoustic signal that have interacted with the substrate at different scattering angles thereby providing additional information of the structure of the substrate and improving an accuracy of the measurement of the topography of at least part of the substrate and the position of the target of the substrate.

According to a second aspect of the invention there is provided a lithographic apparatus comprising an illumination system for providing a beam of radiation, a support structure for supporting a patterning device, the patterning device serving to impart the radiation beam with a pattern in its cross-section, a substrate table for holding a substrate, a projection system for projecting the patterned radiation beam onto a target portion of the substrate, and a sensor apparatus comprising an acoustic assembly arranged to transmit an acoustic signal to the substrate and receive at least part of the reflected acoustic signal after the acoustic signal has interacted with the substrate, a transducer arranged to convert the at least part of the acoustic signal to an electronic signal, and a processor configured to determine both a topography of at least part of the substrate and a position of a target of the substrate based on the electronic signal.

The at least part of the substrate and the target may be located at different depths with respect to the transducer. The processor may be configured to receive the electronic signal from at least two different temporal detection windows such that the processor receives a first part of the electronic signal corresponding to the topography of the substrate from one of the temporal detection windows and a second part of the electronic signal corresponding to the position of the target from the other temporal detection window.

The processor may be configured to at least partially account for the topography of the at least part of the substrate when determining the position of the target of the substrate.

The acoustic signal may be a continuous wave configured to generate at least one standing wave between the transducer and the substrate. The processor may be configured to determine a wavelength of the standing wave based on the electronic signal. The processor may be configured to use the wavelength of the standing wave when determining the topography of the at least part of the substrate and/or the position of the target of the substrate.

According to a third aspect of the invention, there is provided a method of measuring both a topography of at least part of a substrate and a position of a target of the substrate comprising directing an acoustic signal at the substrate, receiving at least part of the acoustic signal after the acoustic signal has interacted with the substrate, and determining both a topography of the at least part of the substrate and the position of the target of the substrate based on the at least part of the acoustic signal.

The at least part of the substrate and the target may be located at different depths of the substrate. The method may further comprise receiving the at least part of the acoustic signal during at least two different temporal detection windows such that a portion of the at least part of the acoustic signal corresponding to the topography of the substrate is received from one of the temporal detection windows and another portion of the at least part of the acoustic signal corresponding to the position of the target is received from another temporal detection window.

The method may further comprise generating relative movement between the sensor apparatus and the substrate. The relative movement may be such that the transducer receives the at least part of the acoustic signal after the acoustic signal has interacted with the substrate at a plurality of different locations of the substrate.

The method may further comprise at least partially accounting for the topography of the at least part of the substrate when calculating the position of the target of the substrate.

The acoustic signal may be a continuous wave configured to generate at least one standing wave between the transducer and the substrate. The method may further comprise determining a wavelength of the standing wave based on the received acoustic signal and using the wavelength of the standing wave when determining the topography of the at least part of the substrate and/or the position of the target of the substrate. The acoustic signal may be a pulse.

An embodiment of the invention may include a computer program comprising computer readable instructions configured to cause a computer to carry out a method according to the third aspect of the invention. An embodiment of the invention may include a computer readable medium carrying said computer program.

An embodiment of the invention may include a computer apparatus for determining both a topography of at least part of a substrate and a position of a target of the substrate comprising a memory storing processor readable instructions, and a processor arranged to read and execute instructions stored in said memory, wherein said processor readable instructions comprise instructions arranged to control the computer to carry out a method according to the third aspect of the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV radiation (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
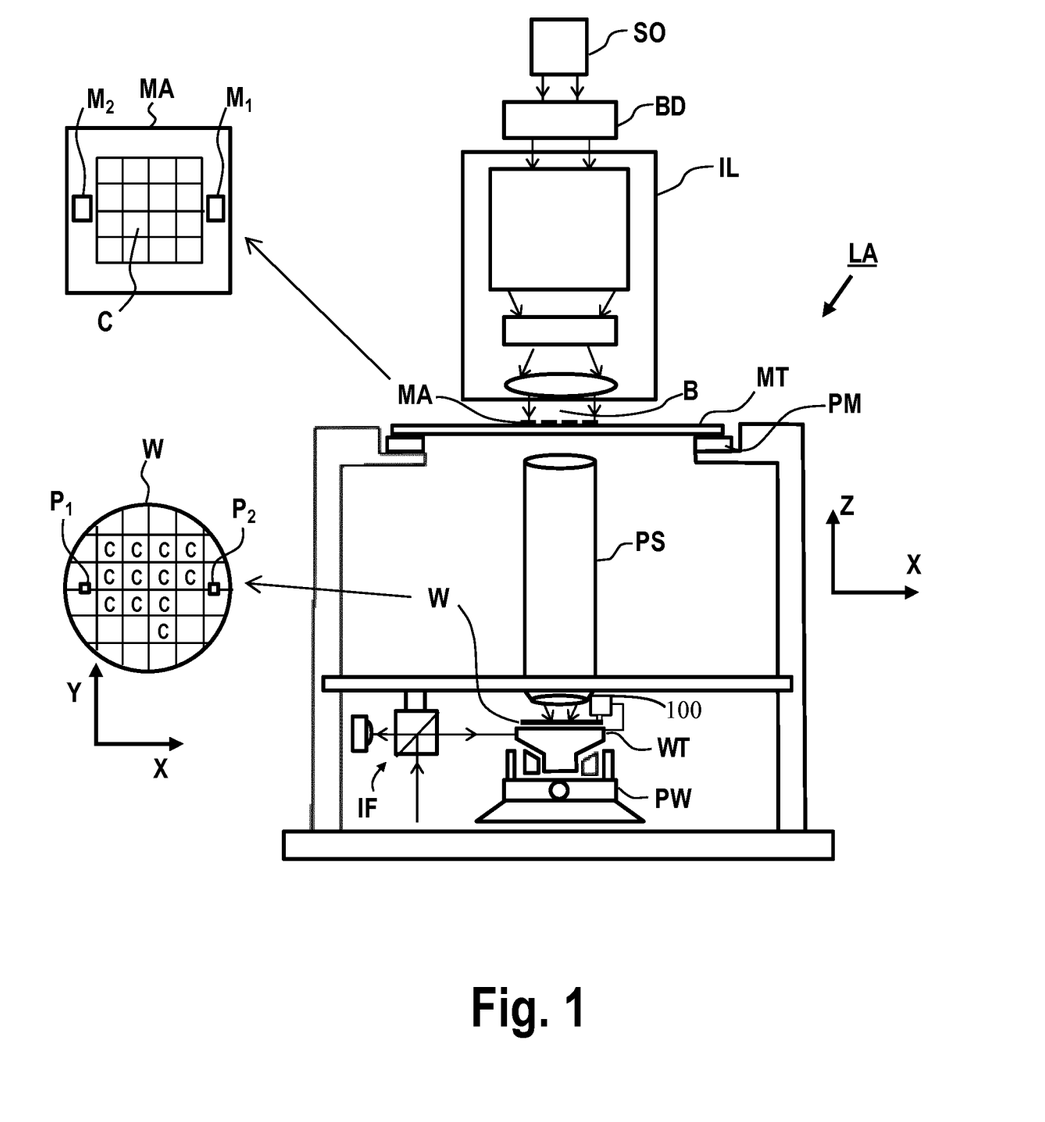
FIG. 1 depicts a schematic overview of a lithographic apparatus comprising a sensor apparatus according to an embodiment of the invention.

FIG. 1 schematically depicts a lithographic apparatus LA comprising a sensor apparatus 100 according to an embodiment of the invention. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross-section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W. This use of liquid may be referred to as immersion lithography. More information on immersion techniques is given in U.S. Pat. No. 6,952,253, which is incorporated herein by reference.

The lithographic apparatus LA may also be of a type having two or more substrate supports WT (also named "dual stage" or "multiple stage"). In such "multiple stage" machines, the substrate supports WT may be used in parallel. Additionally or alternatively, steps involved in the preparation of a subsequent exposure of the substrate W may be carried out on the substrate W located on one of the substrate supports WT while another substrate W on the other substrate support WT is being used for the exposure of a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS and/or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is not beneath the projection system PS.

In operation, the radiation beam B is incident on the patterning device, e.g. mask, MA which is held on the mask support MT, and is patterned by the pattern (i.e. design layout) present on patterning device MA. Having interacted with the mask MA, the radiation beam B passes through the projection system PS, which focuses the radiation beam B onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. The patterning device MA and/or the substrate W may be aligned using mask alignment marks M1, M2 and substrate alignment marks P1, P2. Although the substrate alignment marks P1, P2 shown in the Example of FIG. 1 occupy dedicated target portions C, the substrate alignment marks P1, P2 may be located in spaces between the target portions C. Substrate alignment marks P1, P2 are known as scribe-lane alignment marks when they are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis may be referred to as an Rx-rotation. A rotation around the y-axis may be referred to as an Ry-rotation. A rotation around about the z-axis may be referred to as an Rz-rotation. The x-axis and the y-axis may be described as defining a horizontal plane, whereas the z-axis may be described as being in a vertical direction relative to the horizontal plane. The Cartesian coordinate system does not limit the invention and is merely used for clarification only. Alternatively, another coordinate system, such as a cylindrical coordinate system, may be used to clarify the invention. The orientation of the Cartesian coordinate system may vary such that, for example, the z-axis has a component along the horizontal plane.

Topography measurements of the substrate and measurements of the position of a target of the substrate (e.g. alignment measurements) are traditionally thought of as two separate tasks which require at least two separate sensors performing at least two separate measurements. Each of said measurements typically involves directing radiation at the substrate and analyzing a reflected portion of the radiation. Each measurement has its own unique problems.

Opaque material layers are often applied to the substrate during substrate processing. The opaque layers tend to block at least a significant portion of incident radiation from penetrating said opaque layers. This means that when performing measurements such as, for example, substrate alignment measurements, alignment marks that are obscured by the opaque layers become difficult to detect and/or determine a position thereof. This may negatively affect an accuracy of the target position measurement, which may in turn lead to inaccurate lithographic exposures and faulty resulting electronic products. Performing optical measurements through one or more opaque substrate layers is a significant challenge for the manufacturing of memory architectures such as, for example, 3D NAND and/or X-point (i.e., layered memory cells). Such memory architectures (e.g., random access memory architectures) are characterized by a hard mask layer (e.g., amorphous Carbon) having a thickness of between about 1 μm and about 5 μm and metal layers (e.g., Tungsten) having a thickness of between about 100 nm and about 900 nm deposited on the substrate. Targets (such as alignment marks) located beneath said layers may be difficult to accurately detect using known optical sensors. The same or similar problems may be encountered when performing other measurements such as, for example, overlay measurements and/or critical dimension measurements using optical sensors.

Topography measurements are also typically performed using optical means, albeit using a separate sensor from the target position sensor. Known topography sensors direct a radiation beam towards the uppermost surface of the substrate which then interacts with the substrate before at least partially returning to the topography sensor for analysis. A portion of the radiation beam may penetrate the uppermost layer of the substrate before reflecting from one or more different layers within the substrate structure. For example, a portion of the radiation beam may reflect from an anti-reflection layer beneath the photoresist of the substrate. The reflected portions of the radiation beam may interfere with each other, resulting in a topography measurement error known as apparent surface depression. Apparent surface depression typically results in significant focus errors during subsequent lithographic processes, which in turn may result in non-functional electronic components being manufactured.

Topography sensors used for lithographic measurements are subject to process dependency errors. Process dependency errors are a form of measurement error which differ depending on how the measured substrate has previously been processed. For example, a topography sensor may provide a particular height measurement for a substrate comprising a silicon base coated with a single layer of photoresist. The topography sensor may generate a different topography measurement for a substrate comprising a silicon base coated with several layers of resist, even if both substrates have substantially the same topography and/or are at substantially the same distance away from the topography sensor. Apparent surface depression is an example of a process dependency error. As previously discussed, apparent surface depression may be caused by interference occurring between internally reflected portions of the measurement radiation beam. For example, an incoming measurement radiation beam may be reflected by different amounts at different interfaces within the substrate. The optical path length of each reflected portion may differ, thereby causing a spreading of the returning measurement radiation beam. The spreading of the returning measurement radiation beam may result in apparent surface depression (i.e., an inaccuracy when measuring a topography of the substrate). Apparent surface depression may be caused by other phenomena such as, for example, the Goos-Haenchen shift. The Goos-Haenchen shift is a lateral translation of radiation along a reflecting surface during reflection. The lateral translation of radiation may be dependent upon the materials and structures of the substrate. The lateral translation of radiation may be wavelength and/or polarization dependent. A thickness, material and relative positioning of layers within the structure of the substrate may all contribute to interference of the measurement radiation beam and/or the Goos-Haenchen shift. As a result of apparent surface depression the substrate may not be correctly located in the focus plane of the projection system. When this occurs the resolution of a pattern imaged onto the substrate may be compromised.

Process dependent apparent surface depression is by its nature very difficult to monitor. Although some calibration for process dependency may be performed, residual process dependent apparent surface depression may remain. Different processes give rise to widely varying apparent surface depression, so that a different calibration is needed for each process. In addition, different lithographic apparatus experience widely varying apparent surface depression in response to the same processes (i.e., a given process may give rise to a particular apparent surface depression in one lithographic apparatus, and may give rise to an entirely different apparent surface depression in a different lithographic apparatus). This means that a calibration performed for one lithographic apparatus may not be suitable for use with another lithographic apparatus.

Figure 2:
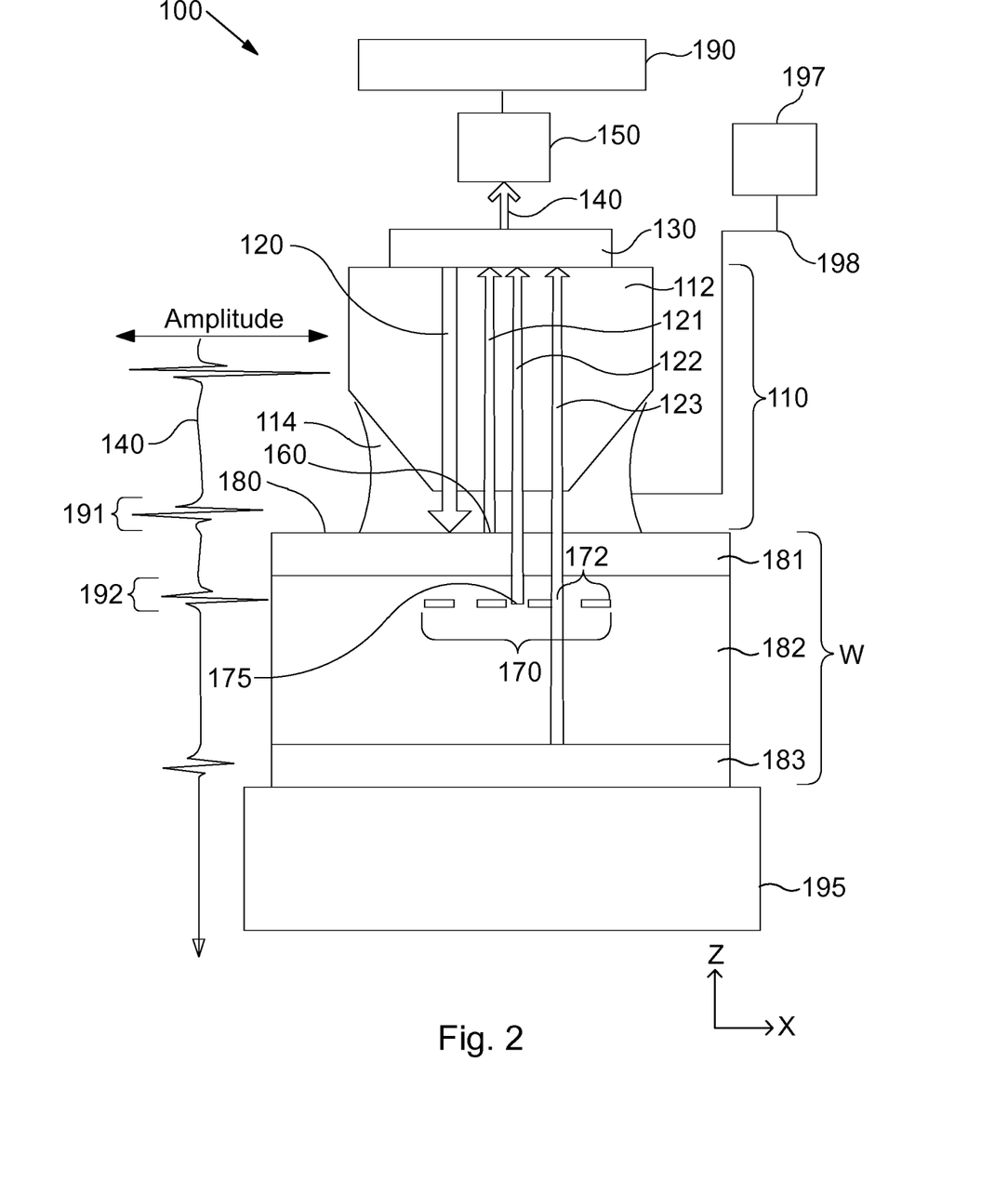
FIG. 2 schematically depicts a sensor apparatus operating in a pulsed mode according to an embodiment of the invention.

FIG. 2 schematically depicts a sensor apparatus 100 operating in a pulsed mode according to an embodiment of the invention. The sensor apparatus 100 comprises an acoustic assembly 110 arranged to transmit an acoustic signal 120 to a substrate W and receive at least part of the acoustic signal 121-123 after the acoustic signal 120 has interacted with the substrate W. In the example, of FIG. 2, the acoustic assembly 110 comprises an acoustic lens 112 and an acoustically transmissive medium 114 connecting the acoustic lens 112 and the substrate W. The acoustic lens 112 is configured to direct the acoustic signal 120 towards the substrate W and/or focus at least part of the acoustic signal 121-123 towards a transducer 130 after the acoustic signal 120 has interacted with the substrate W. Other parts of the acoustic signal 120 that are not shown in FIG. 2 may interact with the substrate W and return to the transducer 130. In other words, not all interactions between the acoustic signal 120 and every interface of the substrate W are shown in FIG. 2. The acoustic lens 112 may comprise a crystal such as, for example, a sapphire crystal. The sensor apparatus 100 may further comprise a second acoustic lens (not shown) configured to direct the at least part of the acoustic signal 121-123 towards the transducer 130. The sensor apparatus 100 may comprise any number of acoustic lenses 112. One example of a sensor apparatus 100 comprising a second acoustic lens is discussed in greater detail below with reference to FIG. 4.

The acoustically transmissive medium 114 is configured to transmit the acoustic signal 120 between the sensor apparatus 100 and the substrate W and/or transmit at least part of the reflected acoustic signal 121-123 towards the sensor apparatus 100 after the acoustic signal 120 has interacted with the substrate W. In the example of FIG. 2, the acoustically transmissive medium 114 transmits the acoustic signal 120 between the acoustic lens 112 and the substrate W and transmits at least part of the reflected acoustic signal 121-123 towards the sensor apparatus 100 after the acoustic signal 120 has interacted with the substrate W. The acoustically transmissive medium 114 may, for example, comprise a body of fluid. The body of fluid may, for example, comprise a body of liquid between the acoustic lens 112 and the substrate W. The liquid may, for example, comprise water. The acoustically transmissive medium 114 may, for example, bridge a distance of between about 1 μm and several mm, e.g., about 10 mm, between the acoustic lens 112 and the substrate W.

The sensor apparatus 100 may comprise a fluid control system 197 configured to provide the body of fluid 114 between the acoustic lens 112 and the substrate W. The fluid control system 197 may comprise one or more conduits 198 configured to provide and/or remove at least some of the body of fluid 114. The fluid control system 197 may be configured to continuously and/or periodically replace the body of fluid 114. The fluid control system 197 may be configured to control one or more aspects of the body of fluid 114 such as, for example, a temperature of the fluid 114, a thickness of the body of fluid 114, etc.

The transducer 130 is arranged to convert the at least part of the reflected acoustic signal 121-123 to an electronic signal 140. The transducer 130 may be further configured to emit the acoustic signal 120. Alternatively, the sensor apparatus 100 may comprise two or more transducers (not shown). One of the transducers may be configured to emit the acoustic signal 120 and the other transducer may be configured to receive the at least part of the reflected acoustic signal 121-123 after its interaction with the substrate W. The transducer 130 may comprise one or more piezo-electric materials such as, for example lead zirconate titanate (PZT, lead-free piezoelectrics, piezopolymers, cellulose-based electroactive paper (EAPap), and other materials used for electromechanical transduction. The transducer 130 may take the form of a film.

Alternatively or additionally the transducer 130 may comprise one or more photoacoustic and/or acousto-optic materials. When using one or more acousto-optic transducers, the acoustic signal 120 may be generated via optical excitement of the acousto-optic transducer. For example, a laser pulse may be used to excite the acousto-optic transducer and thereby generate an acoustic signal 120. Once the acoustic signal 120 has interacted with the substrate W and returned to the photoacoustic transducer, the at least part of the reflected acoustic signal 121-123 interacts with and thereby changes one or more optical properties of the acousto-optic transducer. The change in one or more optical properties of the acousto-optic transducer may be detected and measured by means of an optical signal that interacts with the acousto-optic transducer and is subsequently detected by an optical detector. The detected change in one or more optical properties of the acousto-optic transducer may be used to determine the topography of at least part of the substrate and the position of the target of the substrate.

The sensor apparatus 100 further comprises a processor 150 configured to receive the electronic signal 140 and determine both a topography 160 of at least part of the substrate W and a position 175 of a target 170 of the substrate W based on the electronic signal 140. The target 170 may be referred to as an alignment mark or a metrology mark. The processor 150 may output a signal indicative of the topography 160 of the substrate W and the position 175 of the target 170 to a computer apparatus 190. The computer apparatus 190 may output both a topography 160 of at least part of a substrate W and a position 175 of a target 170 of the substrate W to a user of the sensor apparatus 100.

The substrate W schematically depicted in FIG. 2 may comprise a plurality of layers 181-183. An uppermost layer 181 of the substrate W may, for example, comprise photo-resist, a hard mask, anti-reflection coating, etc. The uppermost layer 181 may, for example, have a thickness of between about 10 nm and about 900 nm. A product layer 182 of the substrate W may, for example, comprise features such as, for example, metallic and semiconductor structures that form, for example, transistors, vias, etc. The product layer 182 typically comprises multiple layers such as, for example, a layer comprising the target 170. The product layer 182 may, for example, have a thickness of between about 1 μm and about 10 μm. A base layer 183 of the substrate W may, for example, comprise Silicon. The base layer 183 may, for example, have a thickness of between about, 100 μm and about 950 μm. Each layer 181-183 may comprise one or more structures such as, for example, the target 170. The topography 160 (e.g. the shape, arrangement and/or curvature) of an uppermost surface 180 of the substrate W (with respect to the sensor apparatus 100) may be determined using the sensor apparatus 100. The sensor apparatus 100 may be used to determine the topography of another layer, e.g., any buried layer 182, 183, of the substrate W.

The sensor apparatus 100 may further comprise an actuation system 195 configured to generate relative movement between the sensor apparatus 100 and the substrate W. The relative movement between the substrate W and the transducer 130 generated by the actuation system 195 may be such that the transducer 130 receives the at least part of the reflected acoustic signal 121-123 after the acoustic signal 120 has interacted with the substrate W at a first region of the substrate W and, after relative movement, subsequently receives a further part of the acoustic signal (not shown) after the acoustic signal 120 has interacted with the substrate W at a different region of the substrate W. That is, the actuation system 195 may cause relative movement between the transducer 130 and the substrate W such that a plurality of different regions of the substrate W and/or different targets 170 belonging to the substrate W may be probed by the acoustic signal 120 and subsequently detected by the transducer 130. The actuation system 195 may, for example, comprise the same or substantially similar components as the second positioner PW and position measurement system IF shown in FIG. 1. The actuation system 195 may be configured to scan any part of the substrate W beneath the transducer 130. The actuation system 195 may be configured to modulate a position of the substrate W with respect to the acoustic assembly 110 in one or more directions such that a given location on the substrate W interacts with the acoustic signal 120 a plurality of times. The actuation system 195 may be configured to scan the entire substrate W beneath the transducer 130 (e.g., move the substrate W by about 300 mm along the X axis and/or the Y axis) to obtain a complete topographical measurement of the substrate W. The actuation system 195 may scan the substrate W beneath the transducer 130 by a distance of between about 10 μm and about 1 mm. The actuation system 195 may scan the substrate W at a scanning frequency of between about 20 Hz and about 900 Hz. The actuation system 195 may scan the substrate W at any desired frequency. Scanning the substrate W at lower frequencies may necessitate a greater amount of time to perform a measurement, e.g., to measure a topography of an entire surface of the substrate W. For example, the actuation system 195 may scan the substrate W beneath the transducer 130 by a distance of about 2 mm at about 50 Hz, thus providing a rapid measurement. That is, the actuation system 195 may cause relative movement between the transducer 130 and the substrate W along a scanning axis (e.g., the X axis or the Y axis, the Y axis being perpendicular to both the X and Z axes) in one direction by about 2 mm and then in the opposite direction along the scanning axis by about 2 mm and repeat this motion about 50 times in about one second. The actuation system 195 may be configured to scan the substrate W in any direction and/or any angle with respect to the transducer 130. The actuation system may be configured to move the substrate W along the Z-axis. For example, the actuation system 195 may be configured to bring the substrate W and transducer 130 closer together along the Z-axis in order to enhance a strength of an reflected acoustic signal 121-123 detected by the transducer 130.

The sensor apparatus 100 is capable of measuring the position 175 of the target 170 and the topography 160 of the substrate W simultaneously. The acoustic signal 120 is at least partly reflected at the uppermost surface 180 back towards the transducer 130. A part of the acoustic signal 120 penetrates the uppermost surface 180 and is in turn at least partially reflected at one or more interfaces between layers 181-183 below the uppermost surface 180 and/or at features (such as the target 170) within the substrate W. This results in a series of reflected acoustic signals 121-123 returning from the substrate W to the transducer 130. Each returning acoustic signal 121-123 (or echo) corresponds to a reflection at a specific interface between layers 181-183 and/or features 170 within the substrate W. By analysing the time of flight of the reflected acoustic signals 121-123 a topography 160 of the substrate W and/or a position 175 of the target 170 may be determined. For example, when the acoustic signal 120 is directed to a region of the substrate W that does not comprise the target 170, the acoustic signal 120 will not reflect from the target 170 and the transducer 130 will not receive a part of the acoustic signal corresponding to the position of the target 170. When the acoustic signal 120 is directed to a region of the substrate W that does comprise the target 170, the acoustic signal 120 will reflect from the target 170 and the transducer 130 will receive a previously absent part 122 of the acoustic signal 120 corresponding to the position 175 of the target 170. Thus, the position of the substrate W relative to the transducer 130 when the previously absent part 122 of the acoustic signal 120 is detected by the transducer 130 corresponds to the position 175 of the target 170 with respect to the sensor apparatus 100.

In the example of FIG. 2, the topography 160 of the substrate W and the target 170 are located at different depths with respect to the transducer 130. The reflected acoustic signals 121-123 may be discriminated by electronically gating the processor 150 such that the time of flight (and thus the travel distance) of each reflected acoustic signal 121-123 may be determined. That is, the processor 150 may be electronically gated to receive the electronic signal 140 during two different temporal detection windows 191, 192 such that the processor 150 receives a first part of the electronic signal 140 corresponding to the topography 160 of the substrate W in one of the temporal detection windows 191 and a second part of the electronic signal 140 corresponding to the position 175 of the target 170 in the other temporal detection window 192. Thus, a distance between the sensor apparatus 100 and at least part of a surface, e.g., the uppermost surface 180 and/or one or more buried surfaces of the substrate W (e.g., to be used for one or more topography measurements) as well as the position of buried surfaces and/or objects (e.g., to be used for the alignment measurement of the position of the target 170) can be determined using a single sensor apparatus 100 and a single acoustic signal 120. Since reflected acoustic signals 120-123 can propagate through opaque materials (e.g., the uppermost layer 181), buried structures (e.g., the target 170) can be probed and detected by the sensor apparatus 100 during a single measurement period during which the topography 160 of at least part of the substrate W is also determined. That is, the sensor apparatus 100 may provide simultaneous alignment and topography measurements.

The at least part of the reflected acoustic signal 121-123 returning to the transducer 130 may be measured by setting electronic gates 191, 192 for the processor 150 that each correspond to different depths of the substrate W with respect to the transducer 130. In order to determine a temporal window at which an electronic gate 191, 192 should be set, an initial acoustic signal 120 may be provided and the reflected part 121-123 of the initial acoustic signal 120 may be monitored. The returning part 121-123 of the initial acoustic signal 120 may be analysed to determine a structure (internal and/or external) of the substrate W. For example, an image of the structure of the substrate W may be determined by analysing the time of flight of the reflected at least part 121-123 of the initial acoustic signal 120. A surface of interest may be selected from the determined structure, and a corresponding electronic gate 191, 192 may be set via the processor 150. The electronic gates 191, 192 may be set using the processor 150 and one or more switches (not shown) configured to activate and deactivate the sensor apparatus 100. The switches may comprise fast switches. For example, the switches may be configured to activate and deactivate the sensor apparatus 100 such that the electronic signal 140 only corresponds to returning acoustic signals of interest 121, 122 when determining alignment position of the target 170 and topography 160 of at least part of the substrate W. The reflected acoustic signals 121-123 may be compared with the initial acoustic signal 120 to determine which surface and/or feature of the substrate W is being detected. Alternatively, electronic gating 191, 192 of the processor 150 may be performed in a post-processing step after a measurement has taken place using the sensor apparatus 100. Some prior-knowledge of the structure of the substrate W may be used to select the electronic gates 191, 192 in the post-processing step and/or during analysis of an initial acoustic signal 120 (i.e., the temporal detection windows of the sensor apparatus 100).

A wavelength of the acoustic signal 120 may be selected in at least partial dependence on a size of the target 170. For example, the target 170 may comprise a grating pattern or a checkerboard pattern, and the acoustic signal 120 may have a wavelength that is about the same or smaller than a pitch 172 of the pattern of the target 170. The wavelength of the acoustic signal 120 may, for example, be about four times less than a pitch 172 of the target 170. The pitch 172 of the target 170 may, for example, be between about 0.5 µm and about 20 µm. The pitch 172 of the target 170 may, for example, be about 5 µm. The frequency of the acoustic signal 120 is related to its wavelength via the following equation:

$$\lambda = \frac{C}{v}.$$

Where λ is the wavelength of the acoustic signal 120, v is the frequency of the acoustic signal and C is the speed of the acoustic signal. For example, the acoustic signal 120 may have a frequency of between about 2 GHz and about 9 GHz, which equates to a wavelength in the submicron range. Such wavelengths are suitable to detect targets 170 having a pitch 172 of between about 0.5 µm and about 20 µm with high accuracy.

An accuracy of a topography measurement performed using the sensor apparatus 100 may be at least partially dependent on the wavelength of the acoustic signal 120. A resolution of the acoustic signal 120 may be about five thousand times smaller than the wavelength of the acoustic signal 120. The acoustic signal 120 may have a frequency in the range of between about 100 MHz and about 10 GHz. Said frequencies may provide adequate resolution for lithographic requirements.

Decreasing a wavelength of the acoustic signal 120 may increase a resolution of the sensor apparatus 100 (i.e., enable smaller features 170 and smaller pitches 172 to be resolved and accurately detected by the sensor apparatus 100). However, decreasing the wavelength of the acoustic signal 120 by too much may lead to the acoustic signal 120 being unable to adequately penetrate the substrate W to a desired depth with respect to the transducer 130. For example, a target 170 buried under multiple layers of the substrate W may not be reached by an acoustic signal 120 having a too short wavelength. Increasing the wavelength of the acoustic signal 120 may increase the depth to which the acoustic signal 120 may penetrate the substrate W. The wavelength of the acoustic signal 120 may be selected by a user of the sensor apparatus 100 in dependence on their desired measurement and the structure of the substrate W they are measuring. The wavelength of the acoustic signal 120 may be selected in at least partial dependence on one or more of the size and/or pitch 172 of the target 170, a depth of the target 170 beneath the uppermost surface 180 of the substrate W, the materials of the layers 181-183 of the substrate W between the transducer 130 and a surface of interest within substrate W, a desired resolution and/or accuracy of the topography and/or target position measurement, etc.

Figure 3:
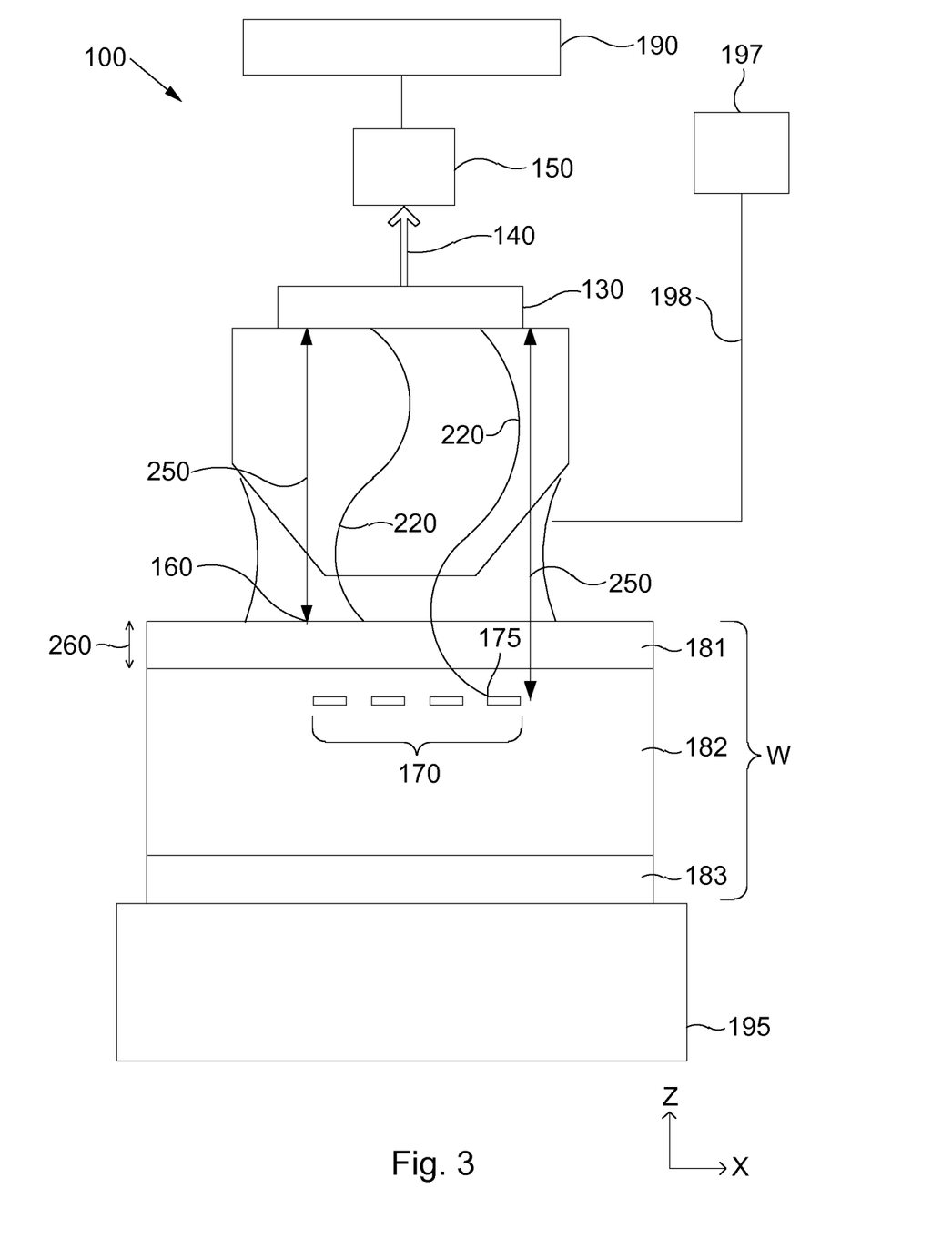
FIG. 3 schematically depicts a sensor apparatus operating in a continuous wave mode according to an embodiment of the invention.

Optionally, the sensor apparatus 100 may be used in a continuous wave mode. FIG. 3 schematically depicts a sensor apparatus 100 operating in a continuous wave mode. The sensor apparatus 100 comprises the same components as the sensor apparatus 100 shown in FIG. 2. In the example of FIG. 3, the acoustic signal 220 is a continuous wave. The continuous wave reaches the substrate W, reflects from the substrate W and returns to the transducer 130. This generates at least one standing wave 220 between the transducer 130 and the substrate W. It will be appreciated that the acoustic signal and resulting standing waves 220 have been illustrated in FIG. 3 as simple standing waves for clarity. Other standing waves that are generated by the acoustic signal 220 that are not shown in FIG. 3 may exist between the substrate W and the transducer 130. The processor 150 is configured to determine a wavelength 250 of one or more standing waves 220 based on the electronic signal 140. The processor 150 may be further configured to use the wavelength 250 of the standing wave 220 when determining both the topography 160 of the at least part of the substrate W and the position 175 of the target 170 of the substrate W. For example, the processor 150 may monitor a change in the wavelength 250 of the standing wave 220 throughout relative movement between the substrate W and the transducer 130 (e.g., caused by the actuation system 195) in a scanning direction (i.e. along any direction parallel to the plane of the uppermost surface 180 of the substrate W, e.g. the X axis and/or the Y axis). The changes in the wavelength 250 of the standing wave 220 may be due to changes in the topography of the substrate W and/or the presence of the target 170. Thus, the changes in the wavelength 250 of the standing wave 220 may be used to determine the topography 160 of at least part of the substrate W and/or the position 175 of the target 170.

If the target 170 is buried under one or more layers 181-182 of the substrate W then the layers above the target 170 may warp due to the presence of the target 170. This may in turn warp the topography 160 of the substrate W. A thickness 260 of the uppermost layer 181 of the substrate W may vary due to warping. Warped topography 160 and/or thickness 260 variation of uppermost layer 181 at a region directly above the target 170 may negatively affect an accuracy of a measurement of the position 175 of the target 170. Whether in pulsed mode (e.g., the configuration shown in FIG. 2) or continuous wave mode (e.g., the configuration shown in FIG. 3), topography measurements made by the sensor apparatus 100 may be used to correct alignment measurements made by the sensor apparatus 100. That is, the processor 150 may be configured to at least partially account for the topography 160 and/or thickness 260 of the at least part of the substrate W when determining the position 175 of the target 170 of the substrate W. For example, the warped topography of the substrate W may cause the sensor apparatus 100 to perceive an inaccurate position 175 of the target 170 due to a refraction of the acoustic signal 120 caused by the warped topography of the substrate W. The topography measurement performed by the sensor apparatus 100 may be used to account for the refraction of the acoustic signal 120 caused by the warped topography of the substrate W when determining the position 175 of the target 170.

Figure 4:
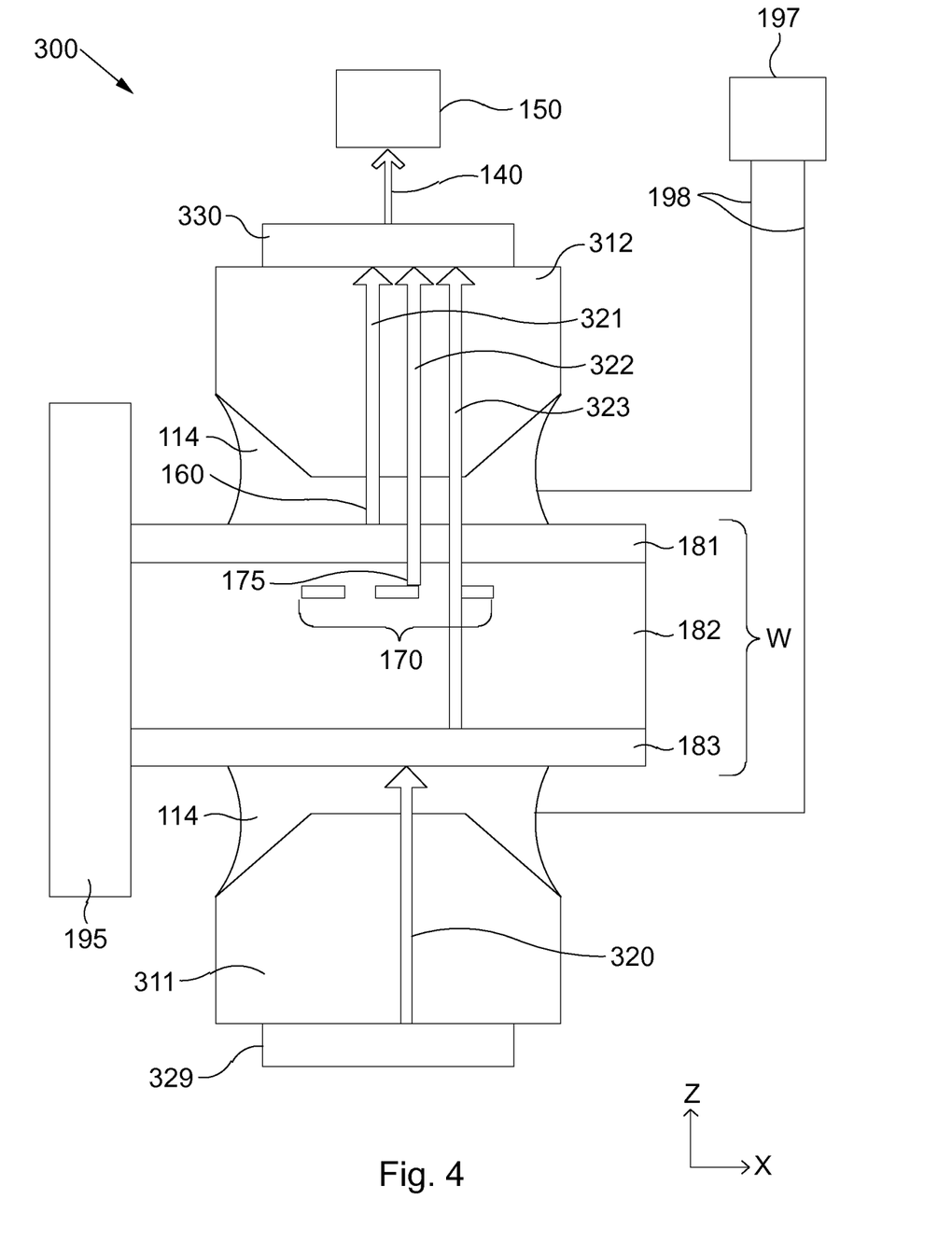
FIG. 4 schematically depicts a sensor apparatus comprising a plurality of acoustic lenses and transducers arranged in a transmission configuration according to an embodiment of the invention.

FIG. 4 schematically depicts a sensor apparatus 300 comprising a plurality of acoustic lenses 311, 312 and transducers 329, 330 arranged in a transmission configuration according to an embodiment of the invention. In the example of FIG. 4 the actuation system 195 is configured to interact with the substrate W at a side of the substrate W so as not to interfere with the transmission configuration of the sensor apparatus 300. A first transducer 329 is configured to emit an acoustic signal 320. A first acoustic lens 311 is configured to transmit the acoustic signal 320 to a substrate W. In the example of FIG. 4, an acoustically transmissive medium 114 (e.g., water) receives the acoustic signal 320 and directs the acoustic signal 320 to the substrate W. The acoustic signal 320 travels through the substrate W and interacts with different interfaces (e.g., interfaces between different layers 181-183 and/or surfaces belonging to a target 170) of the substrate W. Part of the acoustic signal 321-333 exits the substrate W after traversing the substrate and is collected by another acoustically transmissive medium 114 (e.g. water). The acoustically transmissive medium 114 transmits the at least part of the acoustic signal 321-323 to a second acoustic lens 312. The second acoustic lens 312 is located on an opposing side of the substrate W with respect to the first acoustic lens 311. The second acoustic lens 312 receives the at least part of the acoustic signal 321-323 and directs the at least part of the acoustic signal 321-323 to a second transducer 330. The second acoustic lens 312 and the first acoustic lens 311 may share a common axis Z. The second transducer 330 is configured to convert the at least part of the acoustic signal 321-323 to an electronic signal 140. A processor 150 receives the electronic signal 140 and determines both a topography 160 of at least part of the substrate W and a position 175 of the target 170 of the substrate W based on the electronic signal 140. The configuration shown in FIG. 4 may be referred to as a transmission configuration of the sensor apparatus 300. The transmission configuration of the sensor apparatus 300 advantageously obviates or mitigates unwanted interference between different parts 321-323 of the acoustic signal 320, thereby improving an accuracy of the sensor apparatus 300.

Figure 5:
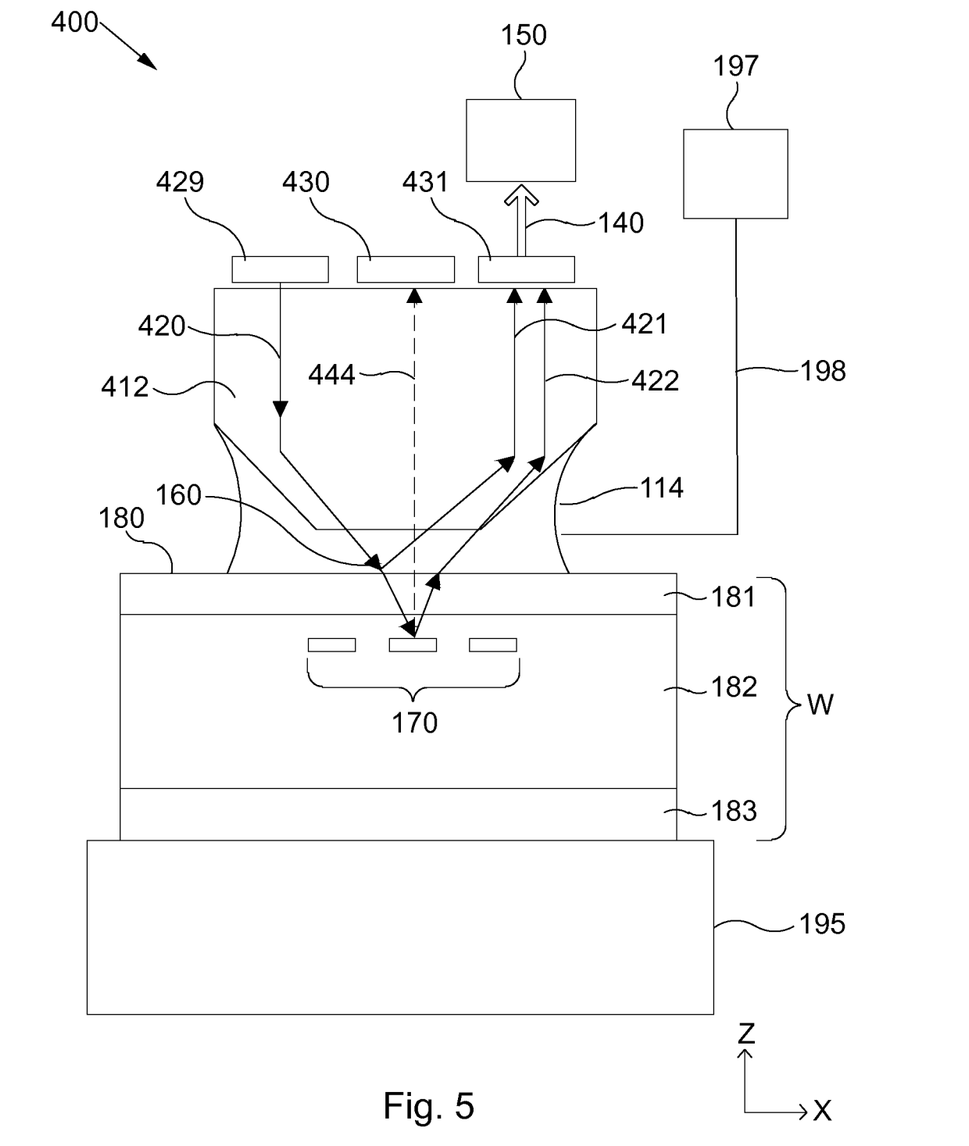
FIG. 5 schematically depicts a sensor apparatus comprising a plurality of transducers arranged in an off-axis incidence configuration according to an embodiment of the invention.

FIG. 5 schematically depicts a sensor apparatus 400 comprising a plurality of transducers 429-431 arranged in an off-axis incidence configuration according to an embodiment of the invention. A first transducer 429 is configured to emit an acoustic signal 420. The acoustic signal 420 is directed through an acoustically transmissive medium 114 to the substrate W by an acoustic lens 412. The acoustic lens 412 transmits the acoustic signal 420 to the substrate W such that the acoustic signal 420 interacts with one or more interfaces of the substrate W (e.g., interfaces between different layers 181-183 and/or surfaces belonging to a target 170) at a non-zero angle with respect to a central axis 444 of the sensor apparatus 400. In the example of FIG. 5, the acoustic signal 420 reflects from an uppermost surface 180 of the substrate W and a surface of the target 170 of the substrate W. At least reflected part 421, 422 of the acoustic signal 420 that has interacted with (i.e., reflected from) interfaces of the substrate W travels back through the acoustically transmissive medium 114 and is collected by the acoustic lens 412. The acoustic lens 412 directs the at least part of the reflected acoustic signal 421, 422 to a second transducer 431. The second transducer 431 is arranged to convert the at least part of the reflected acoustic signal 421, 422 to an electronic signal 140. The sensor apparatus 400 comprises a processor 150 configured to receive the electronic signal 140 and determine both a topography 160 of at least part of the substrate W and a position 175 of the target 170 of the substrate W based on the electronic signal 140. The off-axis incidence configuration advantageously allows the sensor apparatus 400 to detect parts of the reflected acoustic signal 421, 422 that have interacted with the substrate W at different angles of incidence thereby providing additional information of the structure of the substrate W and improving an accuracy of the measurement of the topography 160 of at least part of the substrate W and the position 175 of the target 170 of the substrate W.

Any of the transducers in any of the embodiments of the sensor apparatus 100 may be configured to operate in continuous mode and pulsed mode. Herewith, the sensor apparatus may emit acoustic signals comprising simultaneously a continuous wave and a pulse.

Figure 6:
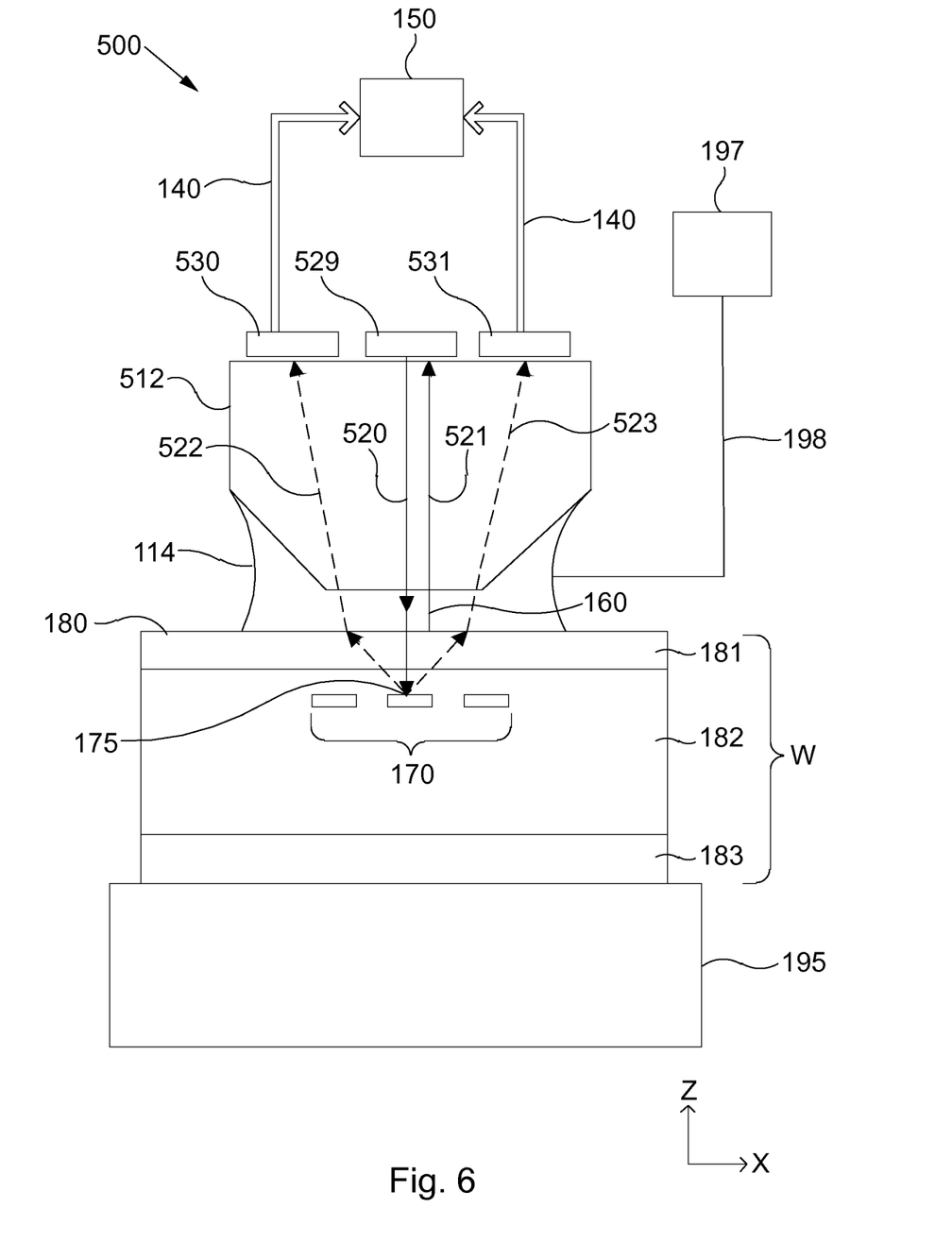
FIG. 6 schematically depicts a sensor apparatus comprising a plurality of transducers arranged in an off-axis detection configuration according to an embodiment of the invention; and, FIG. 7 schematically depicts a transducer arrangement according to an embodiment of the invention.

FIG. 6 schematically depicts a sensor apparatus 500 comprising a plurality of transducers 529-531 arranged in an off-axis detection configuration according to an embodiment of the invention. A first transducer 529 is configured to emit an acoustic signal 520. The acoustic signal 520 is directed through an acoustically transmissive medium 114 to the substrate W by an acoustic lens 512. The acoustic lens 512 directs the acoustic signal 520 to the substrate W such that the acoustic signal 520 interacts with one or more interfaces of the substrate W (e.g., interfaces between different layers 181-183 and/or surfaces belonging to a target 170) at an angle of substantially zero with respect to a central axis of the sensor apparatus 500, not illustrated for reasons of clarity. In the example of FIG. 6, the acoustic signal 520 reflects from an uppermost surface 180 of the substrate W and a surface of the target 170 of the substrate W. At least reflected part 521-523 of the acoustic signal 520 that has interacted with interfaces of the substrate W travels back through the acoustically transmissive medium 114 and is collected by the acoustic lens 512. The acoustic lens 512 directs the at least part of the reflected acoustic signal 521-523 to the first transducer 529, a second transducer 530 and a third transducer 531. The transducers 529-531 are arranged to convert the at least part of the acoustic signal 521-523 to an electronic signal 140. The sensor apparatus 500 comprises a processor 150 configured to receive the electronic signal 140 and determine both a topography 160 of at least part of the substrate W and a position 175 of the target 170 of the substrate W based on the electronic signal 140. The off-axis detection configuration advantageously allows the sensor apparatus 500 to detect parts of the reflected acoustic signal 521-523 that have interacted with the substrate W at different scattering angles thereby providing additional information of the structure of the substrate W and improving an accuracy of the measurement of the topography 160 of at least part of the substrate W and the position 175 of the target 170 of the substrate W.

In general, the sensor apparatus may switch between any of the different configurations described above. For example, if a topography measurement or a target position measurement does not produce an adequate result in one configuration due to, for example, a complex structure of the substrate, the sensor apparatus may switch to a different configuration and repeat the measurement in an attempt to improve the measurement.

Figure 7:
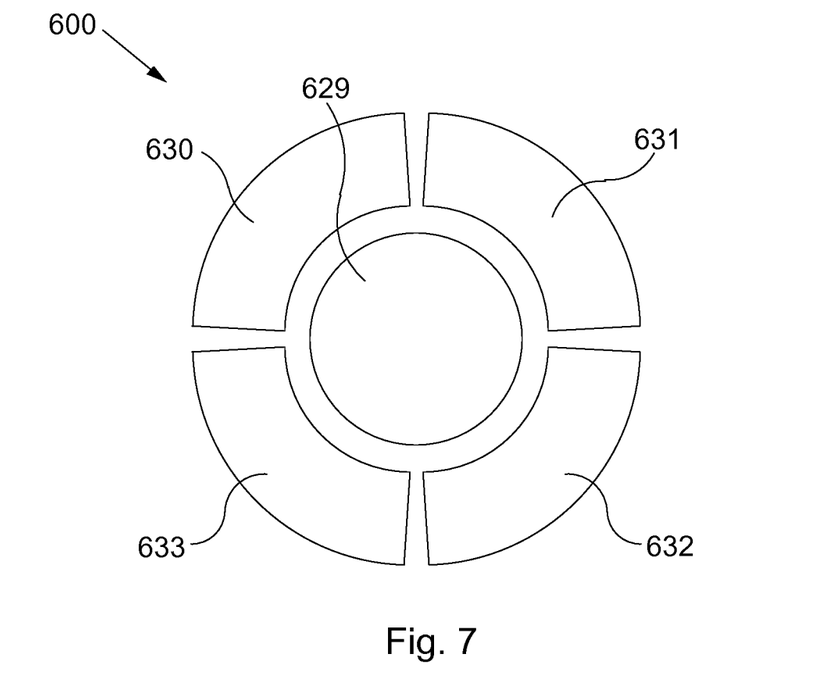

One skilled in the art will appreciate that the aforementioned embodiments may comprise more than one transducer. FIG. 7 schematically depicts a transducer arrangement 600 according to an embodiment of the invention comprising a plurality of transducers. The transducer arrangement 600 comprises five transducers 629-633. A first transducer 629 is generally circular and is located in the middle of the transducer arrangement 600. Second, third, fourth and fifth transducers 630-633 are generally shaped as sectors of an annulus and are located so as to substantially surround the first transducer 629. The transducer arrangement 600 may be used to realise any desired configuration of the sensor apparatus (not shown). For example, in an off-axis detection configuration, the first transducer 629 may be configured to emit an acoustic signal and detect an on-axis part of the acoustic signal after interaction with the substrate. The other transducers 630-633 may be configured to detect scattered off-axis parts of the acoustic signal after interaction with the substrate. Alternatively, in an off-axis incidence configuration, one of the annulus sector transducers 630-633 may emit the acoustic signal and any of the transducers 629-630 may detect parts of the acoustic signal after interaction with the substrate. Any of the transducers 629-633 may emit the acoustic signal and/or detect parts of the acoustic signal after interaction with the substrate. The transducer arrangement 600 shown in FIG. 7 may be used in any of the sensor apparatus shown in FIGS. 2-6.

Any of the transducers in any of the embodiments of the sensor apparatus may comprise an optically reflective member (e.g., a mirror). The optically reflective member may form part of an optical detector. The optical detector may form part of the sensor apparatus. The optical detector may comprise an interferometric detection scheme comprising two or more interferometric branches. After interacting with the substrate, returning parts of the acoustic signal may cause a mechanical displacement of the optically reflective member. Displacement of the optically reflective member may cause a phase change in one of the interferometric branches of the optical detector, which may in turn be detected by the optical detector. The change in phase caused by displacement of the optically reflective member may be monitored over time. The optical detector may then provide an electronic signal indicative of the topography of at least part of the substrate and a position of a target of the substrate to the processor. The processor is configured to receive the electronic signal and determine both the topography of the at least part of the substrate and the position of the target of the substrate based on the electronic signal.

The sensor apparatus 100 may be part of a stand-alone device. The sensor apparatus 100 may form part of a metrology apparatus. The sensor apparatus 100 may be incorporated into a lithographic apparatus, such as that shown in FIG. 1. When the sensor apparatus 100 is part of the lithographic apparatus LA, the sensor apparatus 100 may be arranged as a part of a metrology measurement system that forms part of the lithographic apparatus LA. For example, when part of dual-stage lithographic apparatus, the sensor apparatus 100 may be located on a measurement side of the dual-stage lithographic apparatus.

A device, for example a metrology apparatus or a lithographic apparatus LA, may comprise more than one sensor apparatuses 100. This may be advantageous for measuring more targets, for example alignment marks or metrology marks, within a finite time period and herewith increasing throughput. Each sensor apparatus 100 may be configured to provide acoustic signals in a different frequency range. For example, each sensor may be optimized to measure topography of specific material layers and/or to measure the position of target within specific material layer stacks.

EUV lithographic apparatus typically include a vacuum environment proximate the substrate. Transmission of the acoustic signal though a vacuum is not possible. An acoustically transmissive medium (e.g., a fluid such as water) may therefore be provided between the transducer of the sensor apparatus and the substrate. However, the introduction of an acoustically transmissive medium to a vacuum environment may pose significant design challenges. The sensor apparatus 100 may be incorporated into a compartment within an EUV lithographic apparatus that does not have a vacuum environment, thus enabling simple introduction of the acoustically transmissive medium within the compartment. Alternatively, the sensor apparatus may be a stand-alone device, separate from the EUV lithographic apparatus.

There may be no vacuum requirements in the stand-alone sensor apparatus, so a topography and/or an alignment measurement (i.e., a measurement of a position of the target belonging to the substrate) may be performed using the stand-alone sensor apparatus before and/or after the substrate has undergone a lithographic process within the EUV lithographic apparatus. Thus, an acoustically transmissive medium may be provided between the acoustic lens or transducer of the sensor apparatus and the substrate without encountering the challenges associated with the maintenance of a vacuum environment. Use of the sensor apparatus as a stand-alone device (whether EUV, DUV or other lithographic apparatus) may be advantageous because throughput of the lithographic apparatus may not be affected by use of the sensor apparatus. The topography information and/or the alignment information obtained by the sensor apparatus 100 may be used in a subsequent lithographic process, e.g., to improve an accuracy of a lithographic exposure to be performed on the measured substrate W.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications such as, for example, imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it will be appreciated that such descriptions are merely for convenience and that such actions result from computing devices, processors, controllers, or other devices executing the firmware, software, routines, instructions, etc. and, in doing so, may cause the actuation system and/or other components of the sensor apparatus to interact with the physical world.

While specific embodiments of the invention have been described above, it will be appreciated that the invention may be utilized in ways that are different to those described above. The descriptions above are intended to be illustrative, not limiting. Thus, it will be apparent to one skilled in the art that modifications may be made to the invention as described herein without departing from the scope of the claims set out below.

The invention claimed is:

1. A sensor apparatus comprising:
an acoustic assembly arranged to transmit an acoustic signal to a substrate having a buried target, and arranged to receive at least part of a reflected acoustic signal after the acoustic signal has interacted with the substrate;

a transducer arranged to convert the at least part of the reflected acoustic signal to an electronic signal; and a processor configured to:
receive the electronic signal,
determine both a topography of at least part of the substrate and a position of the buried target based on the electronic signal, and
at least partially account for the topography of the at least part of the substrate when determining the position of the buried target of the substrate.

2. The sensor apparatus of claim 1, wherein the processor is configured to receive the electronic signal from at least two different temporal detection windows such that the processor receives a first part of the electronic signal corresponding to the topography of the substrate from one of the temporal detection windows and a second part of the electronic signal corresponding to the position of the buried target from another temporal detection window.

3. The sensor apparatus of claim 2, wherein the processor is electronically gated to receive the at least part of the signal from the at least two different temporal detection windows.

4. The sensor apparatus of claim 1, wherein the acoustic signal is a continuous wave configured to generate at least one standing wave between the transducer and the substrate, and, wherein the processor is configured to determine a wavelength of the standing wave based on the electronic signal.

5. The sensor apparatus of claim 1, wherein the acoustic signal is a pulse.

6. The sensor apparatus of claim 1, wherein the transducer comprises a plurality of transducers.

7. The sensor apparatus of claim 1, wherein the acoustic assembly comprises a first acoustic lens configured to direct the acoustic signal towards the substrate.

8. The sensor apparatus of claim 7, wherein the acoustic assembly further comprises a second acoustic lens configured to direct the at least part of the reflected acoustic signal towards the transducer from the substrate.

9. The sensor apparatus of claim 1, further comprising a body of fluid located between the transducer and the substrate.

10. The sensor apparatus of claim 9, further comprising a fluid control system configured to provide the body of fluid.

11. The sensor apparatus of claim 10, wherein the fluid control system is configured to control a temperature of the fluid.

12. The sensor apparatus of claim 1, wherein the acoustic assembly is configured to transmit the acoustic signal having a frequency of between about 100 MHz and about 10 GHz.

13. The sensor apparatus of claim 1, further comprising an actuation system configured to move the sensor apparatus and the substrate relatively to each other.

14. The sensor apparatus of claim 1, wherein the transducer comprises an optically reflective member and wherein the sensor apparatus further comprises an optical detector comprising an interferometric detection scheme configured to detect a mechanical displacement of the optically reflective member.

15. A metrology apparatus comprising the sensor apparatus of claim 1.

16. A lithographic apparatus comprising:
an illumination system for providing a beam of radiation;
a support structure for supporting a patterning device, the patterning device serving to impart the radiation beam with a pattern in its cross-section;
a substrate table for holding a substrate;
a projection system for projecting the patterned radiation beam onto a buried target portion of the substrate; and,
a sensor apparatus of claim 1.

17. A method of measuring both a topography of at least part of a substrate and a position of a buried target of the substrate, the method comprising:
directing an acoustic signal at the substrate;
receiving at least part of the acoustic signal after the acoustic signal has interacted with the substrate; and
determining both the topography of at least part of the substrate and the position of the buried target of the substrate based on the at least part of the acoustic signal, the determining at least partially accounting for the topography of the at least part of the substrate when determining the position of the buried target of the substrate.

18. The method of claim 17, wherein the at least part of the substrate and the buried target are located at different depths of the substrate and wherein the at least part of the acoustic signal is received from at least two different temporal detection windows such that a first temporal detection window corresponds to the topography of the at least part of the substrate and a second temporal detection window corresponds to the position of the buried target.

19. The method of claim 17, further comprising generating relative movement between a sensor apparatus and the substrate.

* * * * *